(12) United States Patent
Nilsson

(10) Patent No.: US 7,405,775 B2
(45) Date of Patent: Jul. 29, 2008

(54) DISPLAY EMPLOYING ORGANIC MATERIAL

(75) Inventor: Boo Jorgen Lars Nilsson, Santa Barbara, CA (US)

(73) Assignee: CBRITE Inc., Goleta, CA (US)

( * ) Notice: Subject to any disclaimer, the term of this patent is extended or adjusted under 35 U.S.C. 154(b) by 141 days.

(21) Appl. No.: 10/759,807

(22) Filed: Jan. 16, 2004

(65) Prior Publication Data
US 2004/0179146 A1    Sep. 16, 2004

Related U.S. Application Data

(60) Provisional application No. 60/440,709, filed on Jan. 17, 2003.

(51) Int. Cl.
*G02F 1/136* (2006.01)

(52) U.S. Cl. ........................................................ 349/43

(58) Field of Classification Search .................. 349/143, 349/43
See application file for complete search history.

(56) References Cited

U.S. PATENT DOCUMENTS

| | | | |
|---|---|---|---|
| 4,042,293 A | 8/1977 | Hanak et al. | |
| 4,223,308 A | 9/1980 | Baraff et al. | |
| 4,251,136 A | 2/1981 | Miner et al. | |
| 4,715,685 A | 12/1987 | Yaniv et al. | |
| 4,952,984 A | 8/1990 | Martens et al. | |
| 5,117,298 A | 5/1992 | Hirai | |
| 5,189,136 A * | 2/1993 | Wudl et al. | 528/86 |
| 5,357,357 A * | 10/1994 | Imazeki et al. | 428/1.31 |
| 5,464,990 A | 11/1995 | Shiratsuki et al. | |
| 5,926,236 A | 7/1999 | Den Boer et al. | |
| 6,008,872 A | 12/1999 | Den Boer et al. | |
| 6,087,196 A * | 7/2000 | Sturm et al. | 438/29 |
| 6,177,921 B1 * | 1/2001 | Comiskey et al. | 345/107 |
| 6,372,154 B1 * | 4/2002 | Li | 252/301.16 |
| 6,380,922 B1 | 4/2002 | Hewes et al. | |
| 6,437,769 B1 | 8/2002 | Kobayashi | |
| 6,441,395 B1 | 8/2002 | Yu et al. | |
| 6,506,438 B2 * | 1/2003 | Duthaler et al. | 427/58 |
| 6,582,504 B1 | 6/2003 | Fujita | |
| 6,623,903 B2 * | 9/2003 | Lamotte | 430/158 |

(Continued)

FOREIGN PATENT DOCUMENTS

EP    1 251 720    10/2002

(Continued)

OTHER PUBLICATIONS

Birnstock et al., "Screen-printed Passive Matrix Displays Based on Light-emitting Polymers" Applied Physics Letters, American Institue of Physics. New York, US, vol. 78, No. 24, Jun. 11, 2001, pp. 3905-3907, XP001077323 ISSN: 0003-6951 abstract.

(Continued)

*Primary Examiner*—David Nelms
*Assistant Examiner*—Phu Vu
(74) *Attorney, Agent, or Firm*—Beyer Weaver LLP

(57) ABSTRACT

A display is disclosed. The display includes a plurality of pixels configured to emit light. The display also includes a plurality of pixel control circuits that are each configured to regulate emission of light from a pixel. The pixel control circuits each include one or more two-terminal switching devices that include an organic semiconductor.

55 Claims, 5 Drawing Sheets

U.S. PATENT DOCUMENTS

| | | |
|---|---|---|
| 6,707,060 B2 * | 3/2004 | Yu et al. .................. 257/5 |
| 6,734,460 B2 | 5/2004 | Okumura et al. |
| 6,852,555 B1 * | 2/2005 | Roman et al. .............. 438/22 |
| 6,864,111 B2 | 3/2005 | Yu et al. |
| 6,891,237 B1 * | 5/2005 | Bao et al. ................ 257/410 |
| 6,958,251 B2 | 10/2005 | Yamazaki |
| 7,030,412 B1 * | 4/2006 | Drzaic et al. ............. 257/59 |
| 2002/0027636 A1 * | 3/2002 | Yamada ................. 349/155 |
| 2002/0080637 A1 | 6/2002 | Yi et al. |
| 2002/0119584 A1 | 8/2002 | Duthaler et al. |
| 2002/0127821 A1 * | 9/2002 | Ohya et al. .............. 438/459 |
| 2002/0179901 A1 * | 12/2002 | Arai et al. ................. 257/40 |
| 2006/0145597 A1 | 7/2006 | Brabec |

FOREIGN PATENT DOCUMENTS

| | | |
|---|---|---|
| WO | WO 00 65653 | 11/2000 |
| WO | WO2004/051750 | 6/2004 |
| WO | WO2004/114008 | 12/2004 |

OTHER PUBLICATIONS

Patent Abstracts of Japan vol. 016, No. 084 (E-1172), Feb. 28, 1992 & JP 03269995 A (Ricoh Co Ltd.), Dec. 2, 1991 abstract.

Office Action mailed Apr. 5, 2007 for U.S. Appl. No. 11/298,098, filed on Dec. 8, 2005.

* cited by examiner

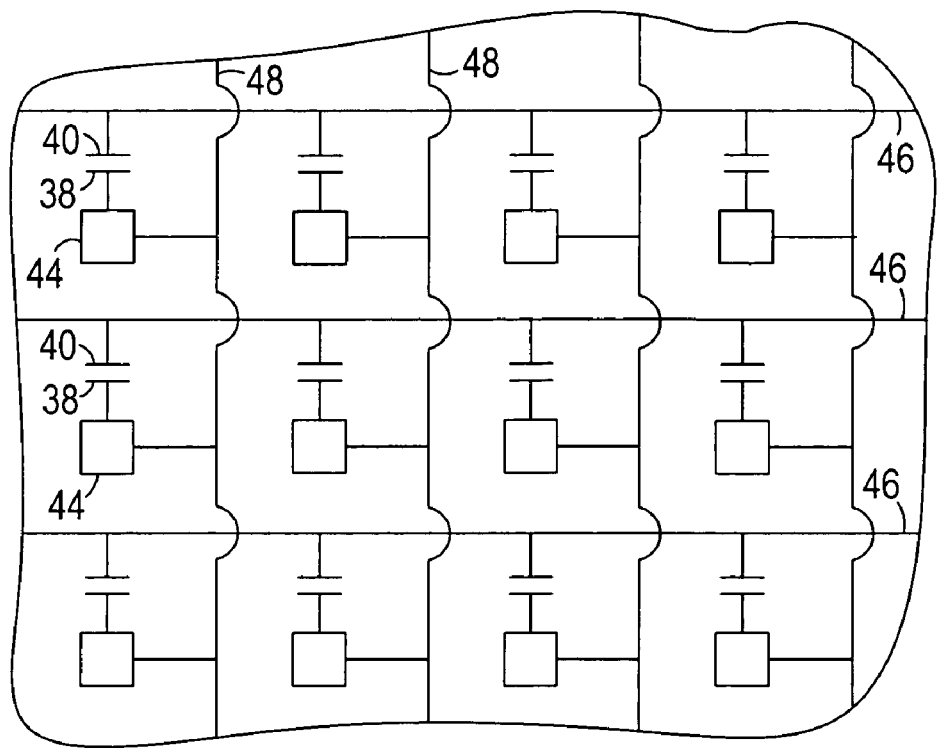
Figure 2
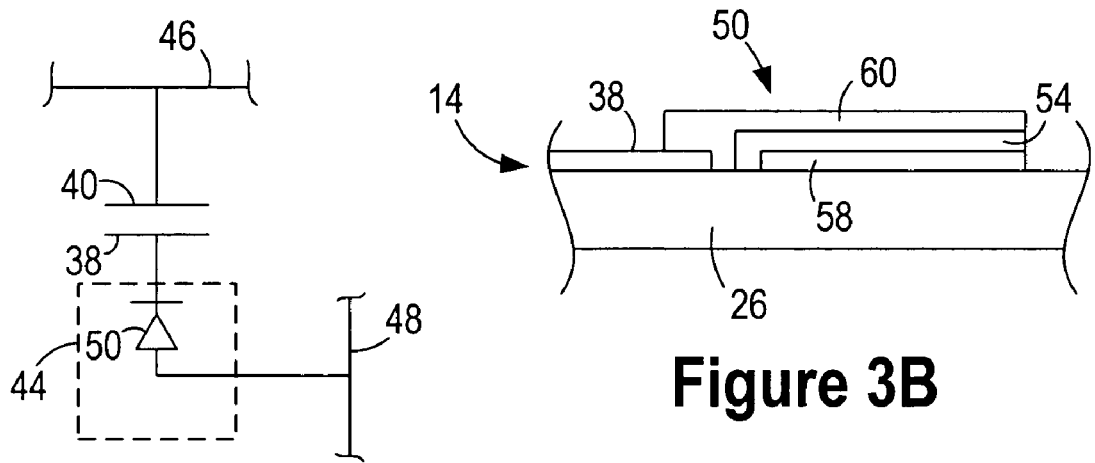
Figure 3B
Figure 3A

DISPLAY EMPLOYING ORGANIC MATERIAL

RELATED APPLICATIONS

This application claims priority to U.S. Provisional Patent Application Ser. No. 60/440,709, filed on Jan. 17, 2003, entitled "Two-Terminal Organic Switching Arrays for Electronic Switching Applications" and incorporated herein in its entirety.

BACKGROUND OF THE INVENTION

1. Field of the Invention

The present invention relates to a display. More particularly, the invention relates to a display that employs switching devices that include organic materials.

2. Background of the Invention

Liquid Crystal Displays (LCDs) are a large portion of the flat panel display market. Additionally, LCDs are often used in portable electronic devices such as cell phones, PDAs, Pocket PCs, automotive displays, GPS navigation systems and laptop computers. Recently, LCDs are replacing CRTs as desktop computer displays and television sets.

LCDs capable of handling increased information content are known as Active Matrix LCDs (AM-LCDs). A switching device is connected to each pixel of an AM-LCD. These switching devices are typically made with thin-film technologies adapted to use with glass substrates. Typical thin-film technologies include amorphous silicon and most recently polysilicon. The manufacturing processes associated with both technologies are tedious, complex and expensive, requiring the glass panels to be processed in expensive vacuum chambers at high temperatures and with long process times. Additionally, AM-LCD back planes typically require 3-10 photolithography mask steps in order to realize the necessary properties. Due to the costs associated with this complexity, a manufacturing line for AM-LCD panels can require capital investments on the order of a billion dollars.

As image information continues to increase, many devices such as second-generation PDAs and cell phones will require a shift to AM-LCD technology. This development will continue to put pressure on the AM-LCD industry to reduce the cost of the AM-LCD manufacturing process. As a result, there is a need for low cost displays that can handle the burdens associated with increasing information demands.

SUMMARY OF THE INVENTION

A display is disclosed. The display includes a plurality of pixel control circuits that are each configured to regulate emission of light from a pixel. The pixel control circuits each include one or more two-terminal switching devices that include an organic semiconductor. In some instances, the display is a liquid crystal display.

Another embodiment of a display includes a plurality of pixel control circuits that are each configured to control the amount of light transmitted through a pixel. Each of the pixel control circuits includes one or more electrodes that include an organic conductor.

Another variation of the display includes a plurality of pixel control circuits on a substrate. Each of the pixel control circuits is configured to control an amount of light transmitted through a pixel on the display. In one embodiment, at least one of the substrates has a melting point less than 400° C. or less than 350° C. In one variation, at least one of the substrates has a melting point in a range of 60° C. to 300° C. In some instances, the substrate has a melting point less than 200° C. At least one of the substrates can be borosilicate glasses, sodalime glasses, mylar, PET (polyethylene terephthalate), polyimides and plastics.

A substrate structure for use in a display is also disclosed. The substrate structure includes a plurality of pixel control circuits connected to a pixel electrode. The pixel control circuits are each configured to regulate emission of light from a pixel and each include one or more two-terminal switching devices that include an organic semiconductor or a metallic conductor.

A method of forming a display is also disclosed. The method includes forming a plurality of pixel control circuits on a substrate. Each of the pixel control circuits is configured to control an amount of light transmitted through a pixel on the display. Forming the pixel control circuits includes depositing a semiconductor on the substrate from a solution. The semiconductor can be an organic semiconductor.

Another variation of the method includes forming a plurality of pixel control circuits on a substrate. Each of the pixel control circuits is configured to control an amount of light transmitted through a pixel. Forming the pixel control circuits includes forming one or more electrodes that include an organic conductor on the substrate.

An organic semiconductor for use with the above embodiments can be a polymer, a conjugated polymer or an oligomer. In some instances, the semiconductor includes a polyacetylene, a poly(phenylene), a poly(phenylene vinylene), a polyfluorene, a polythiophene or a polycyclopentadithiophene. Additionally, the semiconductor can be a co-polymer with a backbone that includes one or more acetylene units, one or more phenylene units, one or more fluorene units, one or more thiophene units or one or more cyclopentadithiophene units. Each of the polymers listed in this paragraph can be substituted or unsubstituted. In some instances, the organic semiconductor is selected from the listed compounds and is soluble in an organic solvent and/or an aqueous solvent. Examples of suitable soluble derivatives include, but are not limited to, MEH-PPV (poly(2-methoxy, 5ethyl, (2'-hexyloxy) para-phenylene vinylene) and poly(3-hexylthiophene).

Organic conductors for use in the electrodes of the above embodiments can be polymers. Examples of suitable polymers include, but are not limited to, polypyrole, polyaniline and poly(ethylen-dioxythiophene).

BRIEF DESCRIPTION OF THE FIGURES

FIG. 2 is a schematic of electronics for selecting a particular pixel on the display. The electronics include a plurality of pixel control circuits. Each pixel is connected to a pixel control circuit. The pixel control circuit is configured to regulate the potential applied to the connected pixel.

FIG. 3A illustrates one example of a pixel control circuit.

FIG. 3B is a cross section of a first substrate structure that includes the pixel control circuit illustrated in FIG. 3A.

DETAILED DESCRIPTION OF THE INVENTION

Electronic switching devices for use with displays are disclosed. The switching devices can employ organic materials as a semiconductor and/or as an electrode. Organic materials can be deposited on a substrate from solution at or near room temperature by inexpensive application methods such as spin-coating, spray-coating, dip-coating or similar methods. These methods eliminate the costly high temperature vacuum processing methods associated with conventional semiconductors such as silicon amorphous silicon and polycrystalline. Further, organic semiconductor materials can be patterned by using a printing method to apply the organic semiconductor to the substrate. Suitable printing methods include, but are not limited to, ink-jet printing, thermal transfer printing, offset and silk-screen printing. Printing eliminates the need for expensive photolithography steps associated with conventional semiconductors. Further, printing can allow the patterning and dispensing associated with conventional semiconductors to be performed in a single step. These processing advantages offer significant cost savings for producing substrates used in conjunction with displays such as AM-LCDs.

These processing techniques are performed at lower temperatures than the vacuum processes associated with conventional semiconductors such as silicon, amorphous silicon and polycrystalline silicon. Accordingly, depositing a semiconductor from solution allows for a broader range of substrate materials. For instance, the substrate can be the typical materials such as glass and ceramics but can also be low melting point polymers and plastics. These new substrate materials can be more flexible than glass and ceramics. Because prior substrate materials generally limit the flexibility of the display, these new material can present the option of flat and flexible displays. Flexible displays can be used under conditions where high mechanical stresses occur.

In some instances, the switching devices are two-terminal switching devices. Two-terminal switching devices that include an organic semiconductor can offer significant advantages over organic three-terminal devices. Three-terminal switching devices employing organic semiconductors suffer from very slow switching speeds due to the inherently low carrier mobility in organic semiconductors. In contrast, two-terminal switching devices can provide the switching speed necessary to use time-domain control of gray-levels as well as to enable full motion video in switched displays.

Figure 1A:
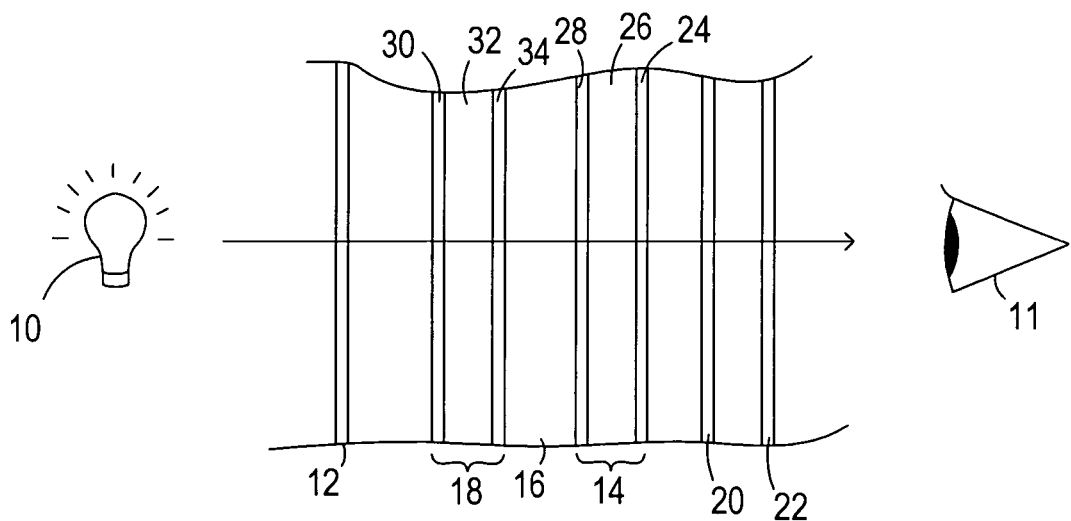
FIG. 1A is a schematic of an example of a liquid crystal display.

FIG. 1A is a schematic of one example of a liquid crystal display. The display includes a plurality of components positioned between a light 10 and an observer 11. The components include a diffuser 12, a first substrate structure 14, a liquid crystal layer 16, a second substrate structure 18, a color filter 20 and a protective member 22. The first substrate structure 14 can include a first polarizer 24, a first substrate 26 and first electronics 28. Additionally, the second substrate structure 18 can include a second polarizer 30, a second substrate 32 and second electronics 34. The display also includes display control electronics (not shown) in electrical communication with the first electronics 28 and the second electronics 34. The display control electronics control the operation of the display. Suitable polarizers include, but are not limited to, a polarized film suitable for bonding to a substrate. The components can be all or partially transmissive so that a portion of the light is transmitted through the components to the observer.

The illustrated display serves as an example of display construction and other display constructions are possible. For instance, the display can be a reflective display rather than a transmissive display. One or more of the components can be integrated. For instance, a polarizer and a substrate can be integrated by employing a polarized substrate. One or more of the components are optional. As an example, a color filter 20 may not be necessary when the display is a black and white display. The protective member 22 is also not required and is often present only to reduce damage to the display by consumers. The components can be positioned in a different sequence than the illustrated sequence. Further, the first substrate structure 14 and the second substrate structure 18 can be switched.

Figure 1B:
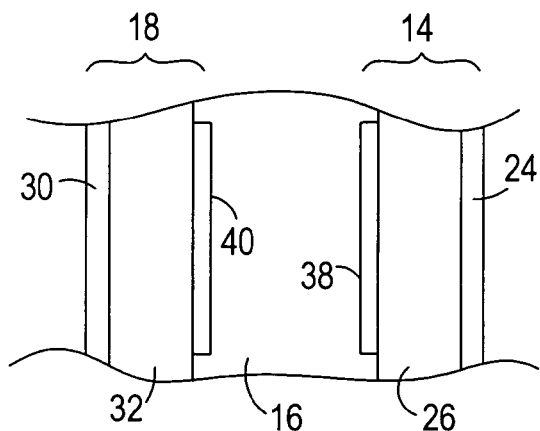
FIG. 1B illustrates a pixel structure suitable for use with the display illustrated in FIG. 1A. The pixel includes liquid crystal positioned between a first pixel electrode and a second pixel electrode.

The display includes one or more pixels. FIG. 1B illustrates a pixel structure suitable for use with the display of FIG. 1A. The pixel includes a first pixel electrode 38 positioned on the first substrate 26 and aligned with a second pixel electrode 40 positioned on the second substrate 32. Suitable materials for the first pixel electrode 38 and the second pixel electrode 40 include, but are not limited to, transparent conductors such as indium tin oxide (ITO), certain metals such as gold, and organic conductors such as polyaniline, polypyrole, polyethylene dioxythiophene. The liquid crystal layer 16 is positioned between the first pixel electrode 38 and the second pixel electrode 40.

During operation of the display, the first polarizer 24 polarizes the light before the light enters the liquid crystal. The light travels through the liquid crystal and then interacts with the second polarizer 30. The amount of light transmitted by the second polarizer 30 is a function of the polarization of the second polarizer 30 and the polarization of the light after passing through the liquid crystal. A potential applied between the first pixel electrode 38 and the second pixel electrode 40 can cause the liquid crystal to change the polarity of the light traveling through the liquid crystal. The amount of potential can be adjusted so as to change the polarization of the light exiting from the liquid crystal. The potential can be changed so as to polarize the light in a direction that increases the amount of light transmitted through the second polarizer 30 or in a direction that decreases the amount of light transmitted through the second polarizer 30. As a result, the potential can be used to adjust the amount of light transmitted through the pixel and accordingly, the amount of light emitted by the pixel.

Figure 1C:
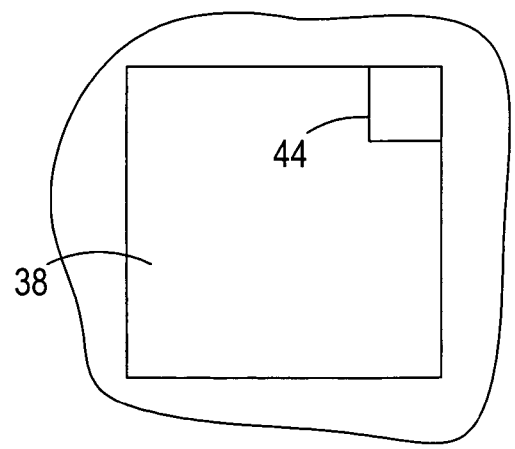
FIG. 1C is a sideview of the first pixel electrode shown in FIG. 1B.

FIG. 1C is a sideview of the portion of first substrate structure 14 illustrated in FIG. 1B. The first substrate structure 14 includes the first pixel electrode 38 and a pixel control circuit 44. The pixel control circuit 44 is configured to regulate the potential level applied to the pixel. Accordingly, the pixel control circuit 44 is configured to regulate emission of light from the pixel.

Although FIG. 1B and FIG. 1C are disclosed in the context of a pixel, the term pixel includes sub-pixels. A sub-pixel is generally a pixel where light transmitted through the pixel passes through a single color on the color filter 20. Accordingly, FIG. 1B and FIG. 1C illustrate a suitable structure for a sub-pixel.

During operation of the display, the display control electronics select a sequence of pixels. The amount of light transmitted through each of the pixels can be changed when that pixel is selected. FIG. 2 is a schematic of the electronics that can be employed to select a particular pixel on the display. The electronics include a plurality of row lines 46 and a plurality of column lines 48. Each of the column lines 48 is in electrical communication with a plurality of pixel control circuits 44 arranged in parallel relative to the column lines 48. Each pixel control circuit 44 is connected in series with a first pixel electrode 38 and a second pixel electrode 40. Each row line 46 is in electrical communication with a plurality of second pixel electrodes 40 that are connected in parallel relative to the row lines 48. The display control electronics select a pixel by applying a bias to a column line 48 that is in electrical communication with the pixel and grounding the row line 46 in electrical communication with the pixel. The bias can be sufficient to cause application of a potential to the liquid crystal. Although FIG. 2 illustrates twelve pixels, the circuit illustrated in FIG. 2 can be scaled to include fewer pixels or more pixels. The display includes an array of the pixel control circuits arranged on the first substrate.

The pixel control circuits 44 can include one or more two-terminal switching devices. Suitable two-terminal switching devices include, but are not limited to diodes and Metal-Insulator-Metal (MIM) devices. As will be discussed in further detail below, the two-terminal switching devices can include organic material(s) as a semiconductor and/or as an electrode.

FIG. 3A illustrates an example of a suitable pixel control circuit 44. The pixel control circuit 44 includes a diode 50 that serves as a two-terminal switching device. The diode 50 is connected between a first pixel electrode 38 and a column line 48. During operation of the display, the diode 50 serves as a switch for switching the pixel on.

FIG. 3B is a cross section of a first substrate structure 14 that includes the pixel control circuit 44 illustrated in FIG. 3A. The substrate structure includes a first pixel and a diode 50. The diode 50 includes a semiconductor 54 positioned on a substrate 26 between a first electrode 58 and a second electrode 60. The second electrode 60 is in contact with the first pixel electrode 38. Although not illustrated, the first electrode 58 is in electrical communication with a column line 48. The material of the first electrode 58, the semiconductor 54 and the second electrode 60 are selected such that the first electrode 58 injects holes into the semiconductor 54 and the second electrode 60 injects electrons into the semiconductor 54. The thickness and/or area of the first electrode 58, the semiconductor 54 and/or the second electrode 60 can be adjusted to alter the performance of the diode 50. Adjusting the thickness and/or area of these components can effect the time for which the pixel can hold a charge. The time for which a pixel holds a charge can be an important factor when there are many pixels to be selected in a single scan of the display.

Figure 4A:
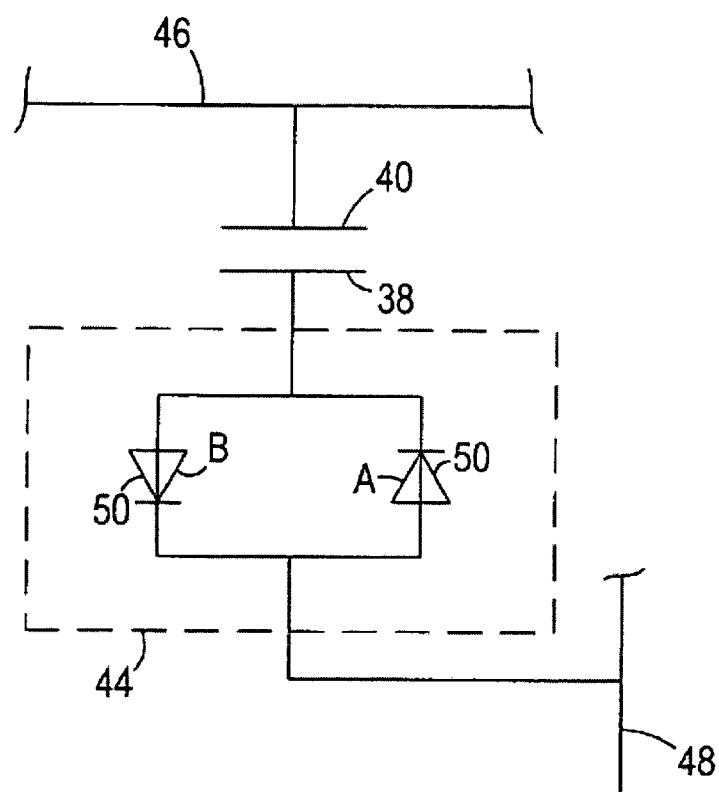
FIG. 4A illustrates another example of a pixel control circuit.

FIG. 4A is another example of a suitable pixel control circuit 44. The pixel control circuit 44 includes two diodes 50 connected in anti-parallel between a first pixel electrode 38 and a column line 48. The illustrated pixel control circuit 44 can be employed to turn a pixel on and to turn a pixel off. When sufficient positive bias is applied to the pixel control circuit 44, the diode 50 labeled A serves to switch the pixel on. When sufficient negative bias is applied to the pixel control circuit 44, the diode 50 labeled B serves to switch the pixel off. Accordingly, the display control electronics can apply a particular bias to the pixel control electronics in order to switch the pixel on or to switch the pixel off.

Figure 4B:
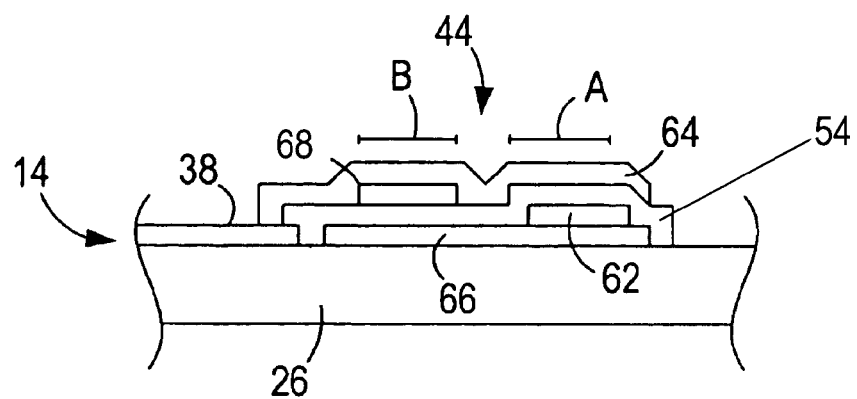
FIG. 4B is a cross section of a first substrate structure that includes the pixel control circuit illustrated in FIG. 4A.

FIG. 4B is a cross section of a first substrate structure 14 that includes the pixel control circuit 44 illustrated in FIG. 4A. The first substrate structure 14 includes a first pixel, a diode 50 labeled A and a diode 50 labeled B. The diode 50 labeled A includes a semiconductor 54 positioned between a first electrode 62 and a second electrode 64. The diode 50 labeled B includes the semiconductor 54 positioned between a third electrode 66 and a fourth electrode 68. The fourth electrode 68 is in electrical contact with a first pixel electrode 38 through the second electrode 64. Although not illustrated, the third electrode 66 is in electrical communication with a column line 48. The third electrode 66 and the first electrode 62 serve as electrodes for diodes 50 and to connect the diodes 50 in parallel. In some instances, the first electrode 62 and the third electrode 66 are made of the same material and/or the second electrode 64 and the fourth electrode 68 are made of the same material.

The pixel control circuits 44 illustrated in FIG. 3A through FIG. 3B are exemplary and other pixel control circuits 44 are possible. For instance, a pixel control circuit 44 can include a plurality of two-terminal switching devices connected in series. In some instances, the in series diodes are connected back to back. An in series connection of diodes 50 can provide the on/off switching ability described with respect to FIG. 3A. Further, a pixel control circuit 44 can include components in addition to the two-terminal switching devices. For instance, a pixel control circuit can also include passive electronic components such as resistors and/or capacitors in addition to the two terminal switching devices.

The semiconductors 54 disclosed in FIG. 3B and FIG. 4B can be semiconductors that are typically employed in integrated circuit and display fabrication. Alternately, the semiconductor 54 materials shown in FIG. 3B and FIG. 4B can be organic. Suitable organic materials for an organic semiconductor include both non-polymers, polymers, conjugated polymers and oligomers. Examples of suitable organic materials include, but are not limited to, polyacetylenes, poly (phenylene)s, poly(phenylene vinylene)s, polyfluorenes, polythiophenes or polycyclopentadithiophenes. Additionally, the semiconductor can be a co-polymer with a backbone that includes one or more acetylene units, one or more phenylene units, one or more fluorene units, one or more thiophene units or one or more cyclopentadithiophene units. The polymers listed in this paragraph can be substituted or unsubstituted. In some instances, the organic semiconductor is selected from the listed compounds and is soluble in an organic solvent and/or an aqueous solvent Examples of suitable soluble materials include, but are not limited to, MEH-PPV (poly(2-methoxy, 5ethyl, (2'-hexyloxy) para-phenylene vinylene) and poly(3-hexyl-thiophene). An organic semicoductor can include a plurality of organic materials or a single organic material. Alternately, the organic semicoductor can include one or more organic materials and one or more non-organic components. In some instances, the conductivity of an organic semiconductor is controlled through doping. Examples of suitable dopants include, but are not limited to, iron chloride, phorphorous-hexafluoride and combinations thereof. For water-soluble systems, examples of suitable dopants include, but are not limited to, polystyrene, sulfonic acid, similar compounds and combinations thereof.

The electrodes and lines disclosed in FIG. 2 through FIG. 4B can be metals such as gold, metallic inorganic materials such as (ITO) and other conductors that are typically employed in integrated circuit and display fabrication. Alternately, the electrodes and lines disclosed in FIG. 2 through FIG. 4B can be organic conductors. Suitable organic conductor can be selected from the class of materials knows as organic metallic polymers. Examples of suitable organic conductors include, but are not limited to, polyaniline, poly(ethylenedioxythiophene), and polypyrole. Example of suitable organic conductors for use as one or more of the pixel electrodes include, but are not limited to, polyaniline, poly(ethylenedioxythiophene), and polypyrole). In some instances, the conductivity of an organic conductor is controlled through doping. Examples of suitable dopants include, but are not limited to, iron chloride, phorphorous-hexafluoride and combinations thereof. For water-soluble systems, examples of suitable dopants include, but are not limited to, polystyrene, sulfonic acid, similar compounds and combinations thereof.

Organic materials can be deposited on a substrate from solution. For instance, organic materials can be applied to the substrate using techniques such as spin-coating, spray-coating, dip-coating or similar methods. In some instances, these techniques can also pattern the organic material on the substrate. For instance, regions of the substrate can be modified such that the solution adheres to the modified regions while not substantially adhering to the unmodified regions or such that the solution adheres to the unmodified regions while not substantially adhering to the modified regions. For example, the regions of the substrate can be modified so as to be more hydrophobic or so as to be more hydrophilic. For instance, the regions can be coated with a hydrophobic or hydrophilic materials to alter the hydrophobic or hydrophilic nature of these regions of the substrate. In another example, a laser is employed to alter the hydrophobic or hydrophilic nature of one or more regions on the substrate. For instance, a laser beam can be applied to a substrate so as to modify the surface at locations where the material is desired. When the substrate is exposed to the solution, the solution adheres to locations where the surface was modified. An example of a suitable substrate for modification with a laser includes, but is not limited to, glass and plastic substrates. By modifying the surface at the locations where the material is desired, the material is patterned on the substrate. In some instances, these techniques are followed by a step where the material is patterned on the substrate. The organic material can be patterned using conventional techniques such as photolithography, laserablation, Reactive Ion beam Etching (RIE) and various plasma etching techniques. The organic material can also be concurrently deposited and patterned using techniques such as ink-jet printing, thermal transfer printing, offset printing and silk-screen printing.

When an organic material is deposited from a solution, the solution can include the organic material and a solvent. In some instances, the solution includes components in addition to the organic material and the solvent. The solvent can be an organic solvent. Examples of suitable solvents include, but are not limited to, toluene, chloroform, xylene. With specific semiconducting organic materials, water can be used as a solvent.

Techniques for applying a solution to the substrate can be performed at reduced temperatures. In contrast, the vacuum process for applying a silicon semiconductor to a substrate are performed at temperatures over 400° C. Accordingly, substrates are typically made of glasses and ceramics that can tolerate the temperatures associated with these vacuum processes. Forming materials on the substrate by applying a solution to the substrate allows for a broader range of substrate materials. In some instances, the display includes one or more substrates with a melting point under 400° C., under 350° C., under 300° C., under 200° C. and/or greater than 60° C. or greater than 100° C.

Suitable materials for the substrate include, but are not limited to, glass and ceramics but also includes polymers and plastics. Examples of substrate materials include, but are not limited to, borosilicate glasses, sodalime glasses, mylar, PET (polyethylene terephthalate) and polyimides. These new materials can be more flexible than glass and ceramics. Because prior substrate materials generally limit the flexibility of the display, these new material can present the option of a display having an increased flexibility.

FIG. 5A through FIG. 5D illustrate a method of forming a first substrate structure according to FIG. 3B. The column lines are formed on a substrate. The column lines 48 can be formed on the substrate using traditional integrated circuit fabrication techniques or traditional display fabrication techniques. Alternately, the column lines 48 can be applied to the substrate in solution. The first pixel electrodes 38 are formed on the substrate 26 to provide the substrate structure 70 illustrated in FIG. 5A. The first pixel electrodes 38 can be formed by integrated circuit fabrication techniques or traditional display fabrication techniques. Alternately, the first pixel electrodes 38 can be applied to the substrate in solution.

Figure 5A:
FIG. 5A through FIG. 5D illustrate a method of forming a substrate structure that includes a pixel control circuit according to FIG. 3B.
Figure 5B:
Figure 5C:
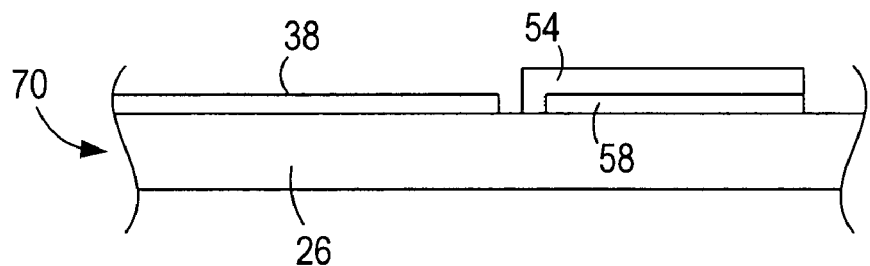
Figure 5D:
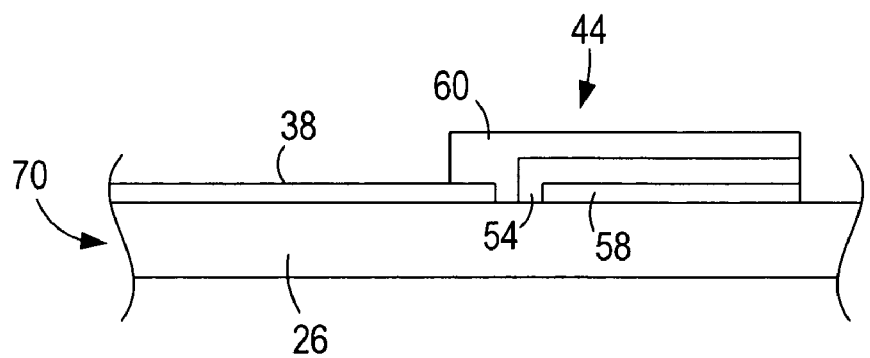

The first electrodes 58 are formed on the substrate 26 so as to provide the substrate structure 70 illustrated in FIG. 5B. The first electrodes 58 can be formed using traditional integrated circuit fabrication techniques or traditional display fabrication techniques. Alternately, the first electrodes 58 can be applied to the substrate in solution. The semiconductor 54 is formed on the substrate 26 so as to provide the substrate structure 70 illustrated in FIG. 5C. The semiconductor 54 can be formed using traditional integrated circuit fabrication techniques or traditional display fabrication techniques. Alternately, the semiconductor 54 can be applied to the substrate 26 in solution. The second electrodes 60 are formed on the substrate 26 so as to provide the substrate structure 70 illustrated in FIG. 5D. The second electrodes 60 can be formed using traditional integrated circuit fabrication techniques or traditional display fabrication techniques. Alternately, the second electrodes 60 can be applied to the substrate 26 in solution.

An example of a traditional integrated circuit fabrication technique for forming a material on the substrate is to deposit the material on the substrate and then pattern the material with photolithography. Sputtering is an example of a suitable method for depositing the material on the substrate.

EXAMPLE 1

A diode having a structure according to FIG. 3B was fabricated with glass as the substrate, an indium Tin Oxide (ITO) electrode as the first electrode, a 100 nm thick layer of MEH-PPV (poly(2-methoxy, 5ethyl, (2' hexyloxy) para-phenylene vinylene) as the semiconductor and an Al electrode as the second electrode. The ITO electrode was formed by sputtering followed by photolithography and subsequent wet etching. The MEH-PPV was formed on the substrate by spin-casting from approximately 0.5% solid in a toluene solution. The Al electrode was formed on the substrate by thermal evaporation and patterning was accomplished by shadow masking.

Figure 6A:
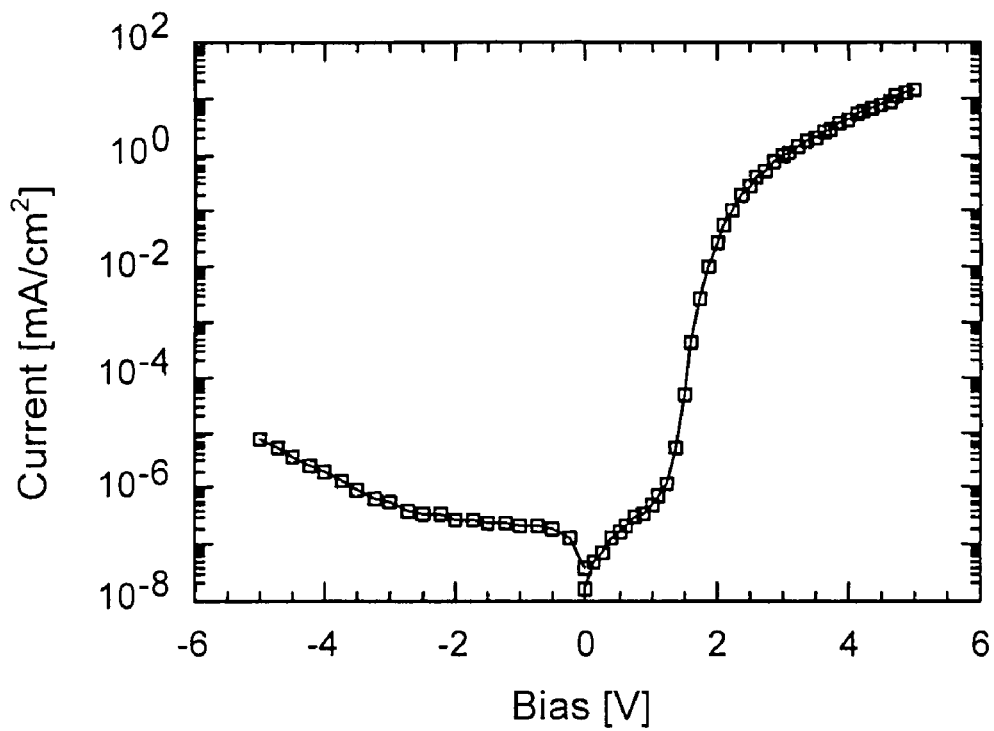
FIG. 6A is a current versus voltage curve for a diode that includes an organic material serving as a semiconductor.

FIG. 6A shows a current versus voltage curve for the diode. Switching of he diode can be achieved by adjusting the voltage level and taking advantage of the large current shift that occurs at a characteristic voltage. The current is on the order of $nA/cm^2$ for voltage below 1.2 V. An exponential current increase over 3-5 orders of magnitude is typically seen in range of 1.2-1.8V. The current continues to increase at higher voltage range in the form of $I\sim V^\alpha$ in which $\alpha$ is typically in range of 3-6. The current ratio between 3 V and 0V is over $10^7$ ($10^9$ has been observed).

Figure 6B:
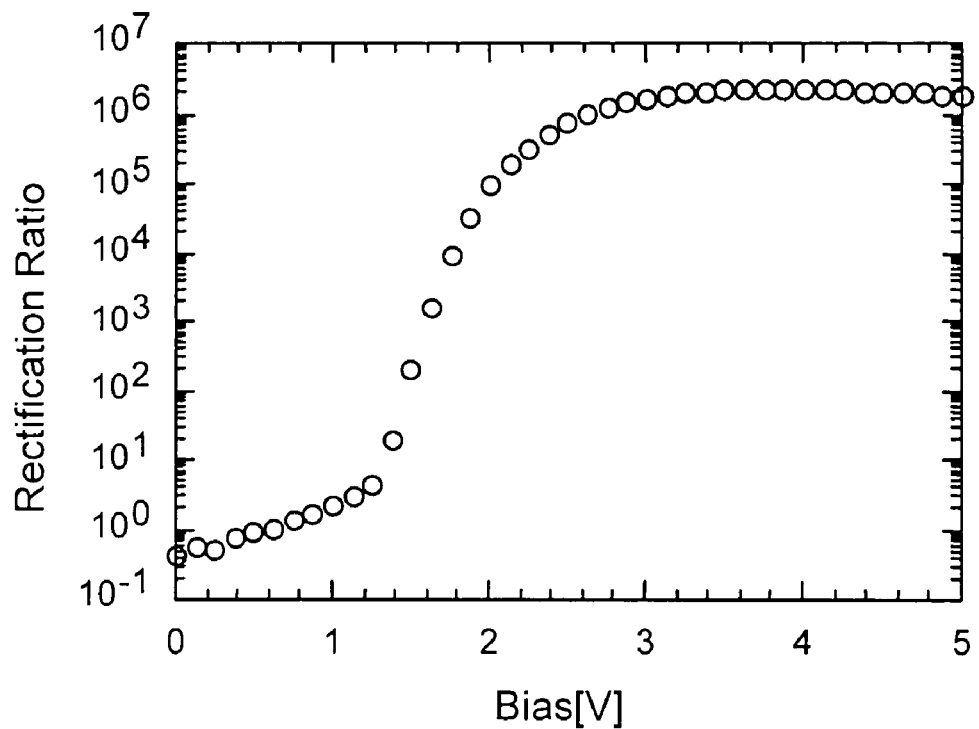
FIG. 6B illustrates the rectification ratio for the diode of FIG. 6A.

FIG. 6B illustrates the rectification ratio of the diode. The rectification ratio at 2.5V (defined as the current ratio between 2.5V and −2.5V) is typically in range of $10^5$-$10^6$ (over $10^7$ has been observed). Operating the diode between a given forward voltage between a forward bias >>2V and zero bias or a reverse bias forms a solid-state, thin film switch with current switching ratio >$2\times10^6$. The switching device has a low resistance state ("ON" state) in range of forward bias larger than 2V and a high resistance ("OFF" state) is achieved at zero and reverse bias.

The current density of a switching device describes the capability of driving current for a give device area. For the diode of Example 1, the current density reaches 15 mA/cm² at 5V. A current density of >500 mA/cm² has been observed in switching devices employing blended organic semiconductors.

The current-voltage characteristic of the diode device can be tuned by changing the selection of electrodes, semiconductor material and/or geometric parameters such as the spacing between the two contact electrodes.

EXAMPLE 2

A diode having a structure according to FIG. 3B was fabricated with galss as the substrate, an indium Tin Oxide (ITO) electrode as the first electrode, MEH-PPV (poly(2-methoxy, 5ethyl, (2' hexyloxy) para-phenylene vinylene) as the semiconductor and an Al electrode as the second electrode. The ITO electrode was formed by sputtering followed by wet etching. The MEH-PPV was formed on the substrate by ink jet printing with a 0.5% solid in a toluene solution. The Al electrode was formed on the substrate by thermal evaporation and patterning was accomplished by shadow masking.

Although the display is disclosed above as having a substrate that includes the pixel control circuit positioned adjacent to a pixel electrode, the pixel control circuits can be remote from the pixel electrodes. For instance, the pixel control circuit can be positioned on a secondary substrate that is independent of the substrates disclosed above. These secondary substrate can be electrically connected to the substrates disclosed above. Alternately, the pixel control circuits can be positioned on the same substrate as the pixel electrodes but in a different location. For instance, the pixel control circuits can be positioned to one or more sides of the pixel electrodes. These arrangements may be able to improve the packing ratio at the expense of adding additional lines to the substrate.

The substrate structures disclosed above can be employed in displays ranging from very small to very large. In one example, the display has a viewing area with a diagonal larger than 14 inches, 20 inches, 30 inches or 40 inches.

Although the two-terminal switching devices are disclosed above as including an organic material serving as a semiconductor, certain embodiments of the invention can be employed using two-terminal switching devices that do not include an organic material serving as a semiconductor. For instance, certain embodiments of the invention can be employed using two-terminal switching devices that include an inorganic semiconductor.

Although the above pixel control circuits disclosed in the context of a liquid crystal display, these pixel control circuits and the methods of forming and using these circuits can be applied to other displays. For instance, a substrate that includes pixel control circuits connected to pixel electrodes can be used in conjunction with displays such as OLEDs, MEMs, electrochromic displays, electrophoretic displays, memory devices, image sensor arrays and other sensor arrays. In some instances, the pixel control circuits regulate reflection of light at a pixel rather than transmission of light through a pixel. An electrochromic display is an example of a display where the pixel control circuits would regulate emission of light from the pixels by regulate reflection of light at the pixels. In some instances, the pixel control circuits are employed to control the level of current applied to a pixel electrode rather than to control the potential applied to a pixel electrode. An OLED display is an example of a display where the pixel control circuits would regulate emission of light from the pixels by controlling the current through a pixel electrode. Additionally, the pixel control circuits can be employed to control detector arrays for visible, X-ray, FIR, MW and RF wavelengths.

The invention claimed is:

1. A method of forming an active matrix display, comprising:
    obtaining a substrate for use in a back plane of the display; and
    forming a plurality of pixel control circuits on the substrate, each pixel control circuit comprising at least one three-layer two-terminal switching device and being configured to regulate light from a pixel;
        wherein forming at least one three-layer two-terminal switching device comprises
        forming a first electrode of the switching devices;
        depositing a single layer of semiconductor from a solution over at least a portion of the first electrode, wherein said depositing comprises forming a patterned layer of the semiconductor; and
        forming a second electrode over at least a portion of the semiconductor and overlying at least a portion of the first electrode.

2. The method of claim 1, wherein the semiconductor is an organic semiconductor.

3. The method of claim 2, wherein the semiconductor is selected from a group consisting of a polymer, a conjugated polymer and an oligomer.

4. The method of claim 2, wherein the semiconductor includes one or more polymers having a backbone with units selected from a group consisting of acetylenes, phenylenes, vinylenes, fluorenes, thiophenes and cyclopentadithiophenes.

5. The method of claim 2, wherein the organic semiconductor includes MEH-PPV (poly(2-methoxy, 5ethyl, (2'-hexyloxy) para-phenylene vinylene).

6. The method of claim 2, wherein the organic semiconductor includes poly(3-hexyl-thiophene).

7. The method of claim 1, wherein the solution includes the semiconductor and a solvent.

8. The method of claim 1, wherein depositing the semiconductor on the substrate includes spin-coating, spray-coating or dip-coating.

9. The method of claim 1, wherein depositing the semiconductor on the substrate includes modifying one or more portions of the substrate such that the solution preferentially adheres to regions of the substrate.

10. The method of claim 9, wherein modifying one or more portions of the substrate includes increasing the hydrophobic nature of one or more portions of the substrate.

11. The method of claim 10, wherein modifying one or more portions of the substrate includes increasing the hydrophilic nature of one or more portions of the substrate.

12. The method of claim 1, wherein depositing the semiconductor on the substrate includes printing the semiconductor on the substrate.

13. The method of claim 12, wherein printing the semiconductor on the substrate includes ink-jet printing, thermal transfer printing, silk-screen printing or offset printing.

14. The method of claim 12, wherein depositing the semiconductor on the substrate includes ink-jet printing.

15. The method of claim 1, wherein forming the circuits on the substrate includes forming electrodes on the substrate and depositing the semiconductor includes depositing at least a portion of the semiconductor over the electrodes.

16. The method of claim 1, wherein forming the circuits on the substrate includes forming one or more electrodes that include an organic conductor on the substrate.

17. The method of claim 1, wherein the substrate has a melting point less than 350° C.

18. The method of claim 1, further comprising:
including the substrate and pixel control circuits in a Micro-Electro-Mechanical Systems (MEMs) display, an organic light emitting diode (OLED) display, an electrochromic display, a Liquid Crystal Display, or an electrophoretic display.

19. The method of claim 1, further comprising:
including the substrate and pixel control circuits in an image sensor array.

20. The method of claim 1, wherein the two-terminal switching device is a diode.

21. The method of claim 1, wherein the two-terminal switching device has a rectification ratio of at least about $10^5$.

22. The method of claim 1, wherein the semiconductor deposited from solution comprises an inorganic semiconductor.

23. The method of claim 1, wherein the two-terminal switching device has an asymmetric current-voltage curve.

24. The method of claim 1, wherein the two-terminal switching device has a ratio of about $10^3$ to $10^9$ between a the current passing at a voltage at which the switching device is on and a current passing at a voltage at which the switching device is off.

25. The method of claim 1, wherein the active matrix display is a Liquid Crystal Display (LCD).

26. The method of claim 1, comprising depositing all of the three layers of at least one of the plurality of two-terminal switching devices by solution-based techniques.

27. A method of forming an active matrix display, comprising:
obtaining a substrate for use in a backplane of the display; and
forming a plurality of pixel control circuits on a substrate, each pixel control circuit comprising at least one three-layer two-terminal switching device and being configured to regulate light from a pixel;
wherein forming at least one two-terminal switching device comprises
forming a first electrode of the switching device;
forming a single lever of patterned organic semiconductor, wherein the organic semiconductor layer overlies at least a portion of the first electrode; and
forming a second electrode over at least a portion of the patterned semiconductor layer and overlying at least a portion of the first electrode.

28. The method of claim 27, wherein the semiconductor includes one or more components selected from a group consisting of a polymer, a conjugated polymer and an oligomer.

29. The method of claim 27, wherein the semiconductor includes one or more polymers having a backbone with units selected from a group consisting of acetylenes, phenylenes, vinylenes, fluorenes, thiophenes and cyclopentadithiophenes.

30. The method of claim 27, wherein the organic semiconductor includes MEH-PPV (poly(2-methoxy, 5ethyl, (2'-hexyloxy) para-phenylene vinylene).

31. The method of claim 27, wherein the organic semiconductor includes poly(3-hexyl-thiophene).

32. The method of claim 27, wherein the two-terminal switching device is a diode.

33. The method of claim 27, wherein the two-terminal switching device has a rectification ratio of at least about $10^5$.

34. The method of claim 27, wherein patterning an organic semiconductor on the substrate includes modifying one or more portions of the substrate such that a solution containing the organic semiconductor preferentially adheres to regions of the substrate.

35. The method of claim 34, wherein modifying one or more portions of the substrate includes increasing the hydrophobic nature of one or more portions of the substrate.

36. The method of claim 34, wherein modifying one or more portions of the substrate includes increasing the hydrophobic nature of one or more portions of the substrate.

37. The method of claim 27, wherein the two-terminal switching device has an asymmetric current-voltage curve.

38. The method of claim 27, wherein the two-terminal switching device has a ratio of about $10^3$ to $10^9$ between a the current passing at a voltage at which the switching device is on and a current passing at a voltage at which the switching device is off.

39. A method of forming an active matrix display, comprising:
obtaining a substrate for use in a backplane of the display; and
forming a plurality of pixel control circuits on the substrate, each pixel control circuit comprising at least one three-layer two-terminal switching device and being configured to regulate light from a pixel;
wherein forming at least one two-terminal switching device comprises
forming a first electrode of the switching device;
forming a patterned semiconductor layer over at least a portion of the first electrode; and
forming a second electrode over at least a portion of the semiconductor layer and overlying at least a portion of the first electrode, wherein one or both of the electrodes include an organic conductor.

40. The method of claim 39, wherein the organic conductor is selected from a group consisting of polyaniline, polypyrrole, polyethylene dioxythiophene.

41. The method of claim 39, wherein forming the one or more electrodes on the substrate includes depositing the organic conductor on the substrate from a solution.

42. The method of claim 41, wherein depositing the organic conductor on the substrate includes spin-coating, spray-coating ox dip-coating.

43. The method of claim 41, further comprising: patterning the organic conductor after depositing the organic conductor on the substrate.

44. The method of claim 43, wherein patterning the organic conductor includes using photolithography to pattern the semiconductor.

45. The method of claim 41, wherein depositing the organic conductor on the substrate includes patterning the semiconductor on the substrate.

46. The method of claim 41, wherein depositing the organic conductor on the substrate includes ink-jet printing, thermal transfer printing, silk-screen printing or offset printing.

47. The method of claim 41, wherein depositing the semiconductor on the substrate includes ink-jet printing.

48. The method of claim 39, wherein the substrate has a melting point less than 350 degrees C.

49. The method of claim 39, wherein the two-terminal switching device is a diode.

50. The method of claim 39, wherein the two-terminal switching device has a rectification ratio of at least about $10^5$.

51. The method of claim 39, wherein forming one or more electrodes includes modifying one or more portions of the substrate such that a solution containing the organic conductor preferentially adheres to regions of the substrate.

52. The method of claim 51, wherein modifying one or more portions of the substrate includes increasing the hydrophobic nature of one or more portions of the substrate.

53. The method of claim 51, wherein modifying one or more portions of the substrate includes increasing the hydrophilic nature of one or more portions of the substrate.

54. The method of claim 39, wherein the two-terminal switching device has an asymmetric current-voltage curve.

55. The method of claim 39, wherein the two-terminal switching device has a ratio of about $10^3$ to $10^9$ between a the current passing at a voltage at which the switching device is on and a current passing at a voltage at which the switching device is off.

* * * * *

UNITED STATES PATENT AND TRADEMARK OFFICE
CERTIFICATE OF CORRECTION

PATENT NO. : 7,405,775 B2
APPLICATION NO. : 10/759807
DATED : July 29, 2008
INVENTOR(S) : Boo Jorgen Lars Nilsson Page 1 of 1

It is certified that error appears in the above-identified patent and that said Letters Patent is hereby corrected as shown below:

In line 12 of claim 27 (column 11, line 51) change "lever" to --layer--.

In line 3 of claim 36 (column 12, lines 16-17) change "hydrophobic" to --hydrophilic--.

Signed and Sealed this

Twenty-fourth Day of February, 2009

JOHN DOLL
*Acting Director of the United States Patent and Trademark Office*